(12) United States Patent
Jun

(10) Patent No.: US 9,887,248 B2
(45) Date of Patent: Feb. 6, 2018

(54) DISPLAY DEVICE AND MANUFACTURING METHOD THEREOF

(71) Applicant: Samsung Display Co., Ltd., Yongin-si, Gyeonggi-do (KR)

(72) Inventor: Woo Sik Jun, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/877,826

(22) Filed: Oct. 7, 2015

(65) Prior Publication Data

US 2016/0204167 A1  Jul. 14, 2016

(30) Foreign Application Priority Data

Jan. 9, 2015  (KR) .......................... 10-2015-0003505

(51) Int. Cl.
   *H01L 27/32*  (2006.01)
   *H01L 51/50*  (2006.01)
   *H01L 51/52*  (2006.01)

(52) U.S. Cl.
   CPC .......... *H01L 27/322* (2013.01); *H01L 27/326* (2013.01); *H01L 27/3248* (2013.01); *H01L 51/502* (2013.01); *H01L 51/5036* (2013.01); *H01L 51/5228* (2013.01)

(58) Field of Classification Search
   CPC ... H01L 33/00; H01L 27/322; H01L 27/3248; H01L 27/326
   See application file for complete search history.

(56) References Cited

U.S. PATENT DOCUMENTS

| 2011/0220869 A1 | 9/2011 | Cho et al. |
| 2016/0133181 A1* | 5/2016 | Nakamura ............... G09G 3/30 345/694 |

FOREIGN PATENT DOCUMENTS

| KR | 10-2010-0004221 A | 1/2010 |
| KR | 10-2011-0101770 A | 9/2011 |
| KR | 10-1361861 B1 | 2/2014 |
| KR | 10-2014-0042274 A | 4/2014 |

OTHER PUBLICATIONS

Caruge, J.M., et al., "Colloidal quantum-dot light-emitting diodes with metal-oxide charge transport layers," Nature Photonics, vol. 2, Apr. 2008, pp. 247-250.

Kim, Tae-Ho, "Colloidal Quantum Dot Light-Emitting Diodes," Polymer Science and Technology, vol. 23, No. 5, 6 pgs, with Abstract.

QD Vision IHS E&M Seminar, Quantum Dot Displays with Color IQ Optics, Oct. 1, 2013 and Oct. 2, 2013, 32 pgs.

* cited by examiner

*Primary Examiner* — Douglas Menz
(74) *Attorney, Agent, or Firm* — Lewis Roca Rothgerber Christie LLP

(57) ABSTRACT

A display device includes a substrate; a plurality of color filters on the substrate, a common electrode covering the plurality of color filters, a white emission layer covering the common electrode, a plurality of pixel electrodes on the white emission layer and a plurality of pixel switching elements on the plurality of pixel electrodes and connected to the plurality of pixel electrodes, wherein the white emission layer includes a plurality of quantum dots.

6 Claims, 6 Drawing Sheets

DISPLAY DEVICE AND MANUFACTURING METHOD THEREOF

CROSS-REFERENCE TO RELATED APPLICATION

This application claims priority to and the benefit of Korean Patent Application No. 10-2015-0003505 filed in the Korean Intellectual Property Office on Jan. 9, 2015, the entire contents of which are incorporated herein by reference.

BACKGROUND

1. Field

The present disclosure relates to a display device and a manufacturing method thereof.

2. Description of the Related Art

A display device mainly uses a flat panel display such as a liquid crystal display, an organic light emitting device, and a plasma display. Particularly, the organic light emitting device includes two electrodes and an organic emission layer interposed therebetween. Electrons injected from one electrode and holes injected from the other electrode are combined in the organic emission layer to form excitons, and the excitons emit light as energy is discharged.

The organic light emitting device of a bottom emission structure emits light through the substrate on which various wires are formed, such that it is difficult to obtain a desirable aperture ratio and for it to be applied to a high resolution device. The organic light emitting device of a top emission structure forms the cathode of the transparent electrode having low conductivity such that it is difficult for it to be applied to a large-sized display device due to a voltage drop.

In the organic light emitting device, to realize a color image, a red organic emission layer, a green organic emission layer, and a blue organic emission layer are respectively formed in a red pixel, a green pixel, and a blue pixel. Alternatively, a white organic emission layer for emitting white light may be formed in the red pixel, the green pixel, and the blue pixel, and a red color filter, a green color filter, and a blue color filter are formed on the white organic emission layer for each pixel, thereby realizing the color image.

However, when realizing the color image by using the white organic emission layer and the color filters formed thereon, a light characteristic such as luminance may be deteriorated.

The above information disclosed in this Background section is only for enhancement of understanding of the background of the disclosure and therefore it may contain information that does not form prior art.

SUMMARY

The present disclosure provides a display device with improved light characteristics such as luminance and that has high resolution and a large size, and a manufacturing method thereof.

According to an aspect of an embodiment of the present invention, a display device may include: a substrate; a plurality of color filters on the substrate; a common electrode covering the plurality of color filters; a white emission layer covering the common electrode; a plurality of pixel electrodes on the white emission layer; and a plurality of pixel switching elements on the plurality of pixel electrodes and connected to the plurality of pixel electrodes, wherein the white emission layer comprises a plurality of quantum dots.

The plurality of pixel switching elements may include: a first insulating layer covering the pixel electrode; a gate electrode on the first insulating layer; a second insulating layer covering the gate electrode; a semiconductor on the second insulating layer and overlapping the gate electrode; a third insulating layer covering the semiconductor; and a source electrode and a drain electrode on the third insulating layer, and respectively connected to the semiconductor through a pair of contact holes at the third insulating layer, wherein the drain electrode is connected to the pixel electrode.

The display device may further include: a connecting member at a same layer as the gate electrode, wherein the connecting member connects the drain electrode and the pixel electrode to each other.

The connecting member may be connected to the pixel electrode through a first connection hole at the first insulating layer, and may be connected to the drain electrode through a second connection hole at the second insulating layer and the third insulating layer.

The display device may further include: a light blocking member between the plurality of color filters; and an auxiliary electrode on the light blocking member, wherein the auxiliary electrode is in contact with the common electrode.

The display device may further include an encapsulation layer covering the plurality of pixel switching elements.

The display device may further include an electron transporting layer and a hole transporting layer at respective sides of the white emission layer, wherein the electron transporting layer and the hole transporting layer include an inorganic layer.

According to another aspect of an embodiment of the present invention, a method for manufacturing a display device may include: forming a plurality of color filters on a substrate; forming a common electrode covering the plurality of color filters; forming a white emission layer covering the common electrode; forming a plurality of pixel electrodes covering the white emission layer; and forming a plurality of pixel switching elements connected to the plurality of pixel electrodes on the plurality of pixel electrodes, wherein the white emission layer comprises a plurality of quantum dots.

The forming of the pixel switching elements may include: forming a first insulating layer covering the plurality of pixel electrodes; forming a gate electrode on the first insulating layer; forming a second insulating layer covering the gate electrode; forming a semiconductor overlapping the gate electrode on the second insulating layer; forming a third insulating layer covering the semiconductor; forming a pair of contact holes at the third insulating layer to expose the semiconductor; and forming a source electrode and a drain electrode respectively connected to the semiconductor through the pair of contact holes at the third insulating layer, wherein the drain electrode is connected to the pixel electrode.

The method may further include forming a connecting member connecting the drain electrode and the pixel electrode, at the same layer as the gate electrode.

The method may further include forming a first connection hole exposing a portion of the pixel electrode, in the first insulating layer, and wherein the forming the pair of contact holes at the third insulating layer may include, forming a second connection hole exposing a portion of the connecting member, at the second insulating layer and the third insulating layer.

The connecting member may be connected to the pixel electrode through the first connection hole, and may be connected to the drain electrode through the second connection hole.

The method may further include: forming a light blocking member on the substrate; and forming an auxiliary electrode on the light blocking member.

The method may further include forming an encapsulation layer covering a plurality of pixel switching elements.

According to an exemplary embodiment of the present disclosure, by forming the pixel switching element thereon after forming the white emission layer including the stable quantum dots in the air atmosphere, the white emission layer is not damaged in the process of forming the pixel switching element, thereby simplifying the manufacturing process and the manufacturing apparatus.

Also, by forming the pixel switching element on the white emission layer, in the case of the bottom emission, a desirable aperture ratio may be easily obtained and the high resolution may be realized.

In addition, when forming the large-sized common electrode of the transparent electrode having low conductivity, the common electrode may be formed to be thick to reduce or minimize the resistance, thereby preventing or reducing the voltage drop and realizing the large-sized display device.

Further, when realizing the color image by using the white emission layer including the quantum dots and the color filter, the light characteristic such as the color reproducibility or the luminance may be excellent compared with the case of using the organic emission layer and the color filter.

DETAILED DESCRIPTION

Figure 1:
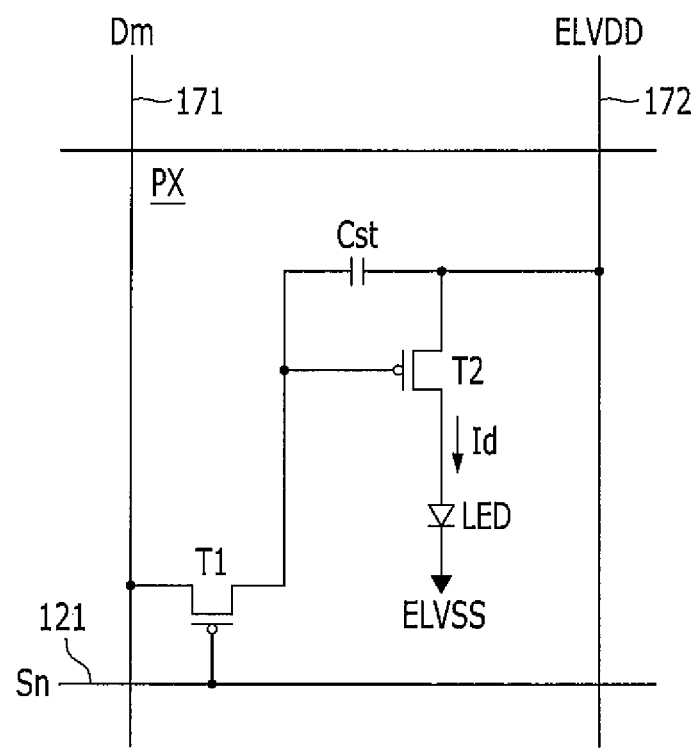
FIG. 1 is an equivalent circuit diagram of one pixel of a display device according to an exemplary embodiment of the present disclosure.

The present disclosure will be described more fully hereinafter with reference to the accompanying drawings, in which exemplary embodiments of the disclosure are shown. As those skilled in the art would realize, the described embodiments may be modified in various different ways, all without departing from the spirit or scope of the present disclosure.

Parts that are irrelevant to the description will be omitted to clearly describe the embodiments of the present disclosure, and the same or similar constituent elements will be designated by the same reference numerals throughout the specification.

Further, since sizes and thicknesses of constituent members shown in the accompanying drawings are arbitrarily given for better understanding and ease of description, the present disclosure is not limited to the illustrated sizes and thicknesses.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or"

includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

The electronic or electric devices and components and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or the like. Further, the various components of these devices may be a process or thread, running on one or more processors, in one or more computing devices, executing computer program instructions and interacting with other system components for performing the various functionalities described herein. The computer program instructions may be stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of ordinary skill in the art should recognize that the functionality of various computing devices may be combined or integrated into a single computing device, or the functionality of a particular computing device may be distributed across one or more other computing devices without departing from the spirt and scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

In the accompanying drawings, an active matrix (AM) type of display device is illustrated to have a 2Tr-1 Cap structure in which two transistors (TFTs) and one capacitor are provided for one pixel, but the present disclosure is not limited thereto. Thus, in the display device, each pixel may be provided with a plurality of transistors and at least one capacitor, and may be formed to have various structures by further forming additional wires or omitting existing wires. In this case, a pixel is a minimum unit (or a smallest unit) for displaying an image, and the display device displays the image through a plurality of pixels. Next, the display device according to an exemplary embodiment of the present disclosure will be described in detail with reference to FIG. 1 and FIG. 2.

FIG. 1 is an equivalent circuit diagram of one pixel of a display device according to an exemplary embodiment of the present disclosure. As can be seen in FIG. 1, the pixel includes only one light emitting element LED, and may alternatively be referred to as a sub-pixel.

As shown in FIG. 1, one pixel PX of the display device according to an exemplary embodiment of the present disclosure includes a plurality of signal lines 121, 171, and 172, a plurality of transistor T1 and T2 connected to the plurality of signal lines, a storage capacitor (Cst), and a light emitting diode LED, which may be an organic light emitting diode (OLED), for example.

The transistors T1 and T2 include a switching transistor T1 and a driving transistor T2.

The signal lines 121, 171, and 172 include a plurality of scan lines 121 for transmitting a scan signal Sn, a plurality of data lines 171 crossing the scan lines 121 and for transmitting a data signal Dm, and a plurality of driving voltage lines 172 for transmitting a driving voltage ELVDD and being substantially parallel to the data lines 171.

The switching transistor T1 has a control terminal, an input terminal, and an output terminal, and the control terminal is connected to the scan line 121, the input terminal is connected to the data line 171, and the output terminal is connected to the driving thin film transistor T2. The switching thin film transistor T1 transmits a data signal Dm applied to the data line 171 to the driving transistor T2 in response to a scan signal Sn applied to the scan line 121.

The driving transistor T2 also has a control terminal, an input terminal, and an output terminal, and the control terminal is connected to the switching transistor T1, the input terminal is connected to the driving voltage line 172, and the output terminal is connected to the light emitting diode LED. A driving current Id having a magnitude that varies according to the voltage between the control terminal and the output terminal, flows through the driving transistor T2.

The storage capacitor Cst is connected between the control terminal and the input terminal of the driving transistor T2. The storage capacitor Cst charges the data signal applied to the control terminal of the driving transistor T2 and maintains it after the switching transistor T1 is turned off.

The light emitting diode LED has an anode connected to the output terminal of the driving transistor T2 and a cathode connected to the common voltage ELVSS. The light emitting diode LED emits light by changing its intensity depending on an output current Id, thereby displaying an image.

The switching transistor T1 and the driving transistor T2 may be n channel electric field effect transistors (FET) or p channel electric field effect transistors. In some embodiments, the connection relation of the transistors T1 and T2, the storage capacitor Cst, and the organic light emitting diode OLED may be changed.

Next, the detailed structure of the display device according to an exemplary embodiment of the present disclosure will be described with reference to FIG. 2.

Figure 2:
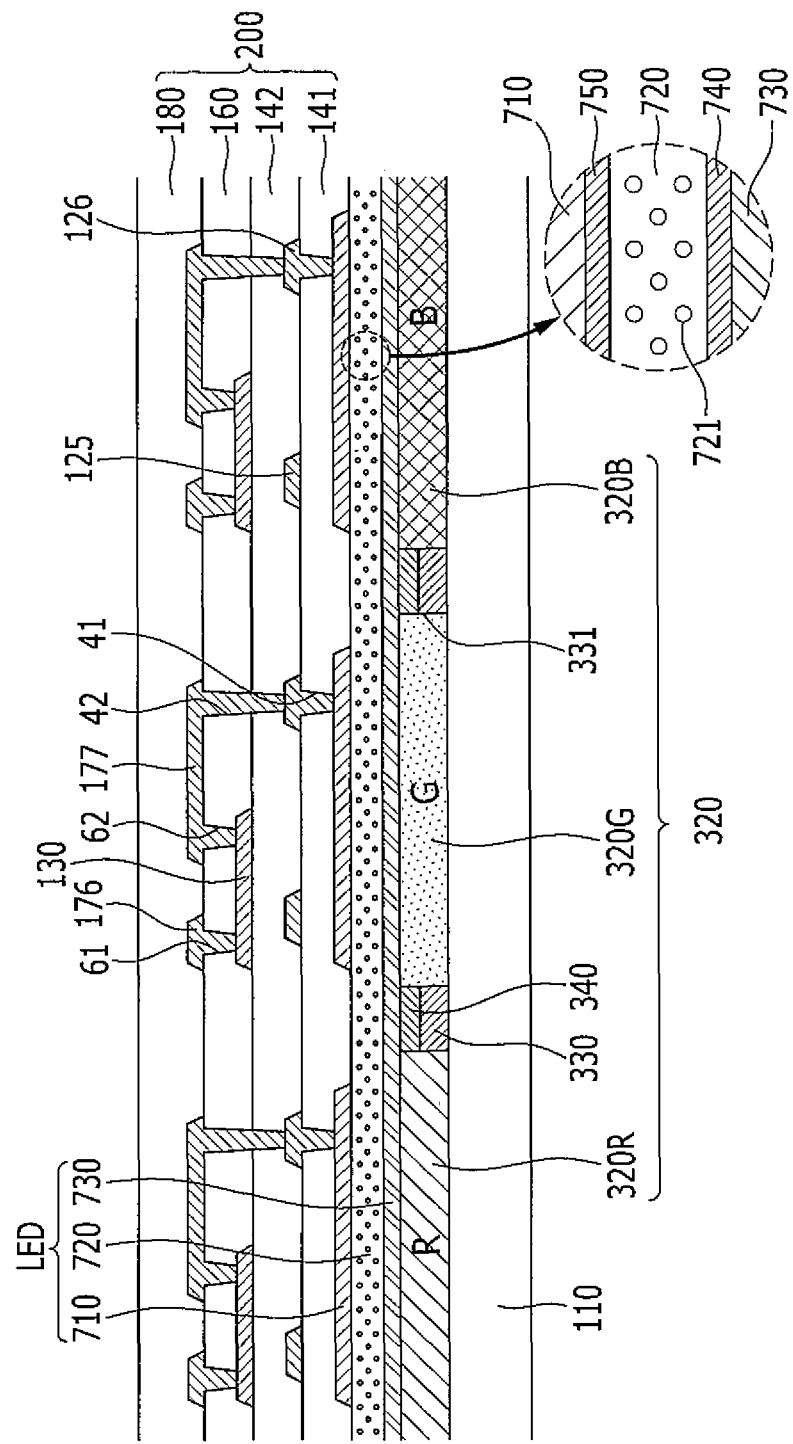
FIG. 2 is a cross-sectional view of a display device according to an exemplary embodiment of the present disclosure.

FIG. 2 is a cross-sectional view of a display device according to an exemplary embodiment of the present disclosure.

As shown in FIG. 2, in the display device according to an exemplary embodiment of the present disclosure, a light blocking member 330 referred to as a black matrix is formed on a first substrate 110.

The first substrate 110 may be formed as an insulating substrate made of glass, quartz, ceramic, or plastic, and the light blocking member 330 may be formed of a metal such as chromium (Cr) or an organic material. The light blocking member 330 has a plurality of openings 331 exposing the first substrate 110. One opening 331 of the light blocking member 330 corresponds to one pixel.

A plurality of color filters 320 are formed in the openings 331 of the light blocking member 330. These color filters 320 may partially overlap the light blocking member 330. The color filter 320 includes a red color filter 320R representing red (R), a green color filter 320G representing green (G), and a blue color filter 320B representing blue (B).

A common electrode 730 covering all of the plurality of color filters 320 is formed on the plurality of color filters 320. The common electrode 730 may be formed of a transparent conductive material such as ITO (indium tin oxide), IZO (indium zinc oxide), ZnO (zinc oxide), or $In_2O_3$ (indium oxide).

An auxiliary electrode 340 is formed between the color filter 320 and the common electrode 730, and the auxiliary electrode 340 is in contact with the common electrode 730. The auxiliary electrode 340 may be formed of the same material as the common electrode 730 or a low resistance material, such that a current moving path (e.g., a current flow path) is added to reduce or minimize resistance of the current flowing to the common electrode 730, thus preventing or reducing the voltage drop.

A white emission layer 720 covering the common electrode 730 is formed on the common electrode 730. The white emission layer 720 may include a plurality of quantum dots 721. The quantum dots 721 may be a semiconductor material having a very small size (e.g., several tens of nanometers to several hundred nanometers) that represents a quantum confinement effect having wide energy band. Accordingly, an energy band gap may be controlled by the size of the quantum dots 721 such that light of various wavelength bands may be emitted, and therefore white light is emitted in an exemplary embodiment of the present disclosure. The white light generated from the white emission layer 720 passes through the color filter 320 thereunder, thereby realizing the color image. The white emission layer 720 including the quantum dots 721 has superior light characteristics such as color reproducibility and luminance compared to the organic emission layer.

A hole transporting layer (HTL) 740 is formed between the white emission layer 720 and the common electrode 730, and an electron transporting layer (ETL) 750 is formed on the white emission layer 720. The hole transporting layer 740 and the electron transporting layer 750 include an inorganic layer. For example, the hole transporting layer 740 may be formed of an inorganic oxide layer such as nickel oxide (NiO), and the electron transporting layer 750 may be formed of an inorganic oxide layer such as ZnO:SnO2. The hole transporting layer 740 and the electron transporting layer 750 made of the inorganic layer may protect the white emission layer 720 from external moisture.

A plurality of pixel electrodes 710 are formed on the white emission layer 720, and one pixel electrode 710 is positioned for each pixel. The pixel electrode 710 is made of a reflective metal such as lithium (Li), calcium (Ca), lithium fluoride/calcium (LiF/Ca), lithium fluoride/aluminum (LiF/Al), aluminum (Al), silver (Ag), magnesium (Mg), gold (Au), etc.

As described above, the light emitting diode LED including the pixel electrode 710, the white emission layer 720, and the common electrode 730 are formed. Here, the pixel electrode 710 functions as a cathode as an electron injection electrode, and the common electrode 730 functions as an anode as a hole injection electrode. However, the exemplary embodiment according to the present disclosure is not limited thereto, and the pixel electrode 710 may be the anode and the common electrode 730 may be the cathode according to the driving method of the display device. Holes and electrons are respectively injected into the white emission layer 720 from the pixel electrode 710 and the common electrode 730, and the quantum dots 721 reach an excited state by receiving the light from the injected electrons and holes, thereby autonomously emitting the light depending on the energy band gap.

A plurality of pixel switching elements 200 are formed on the plurality of pixel electrodes 710. The pixel switching elements 200 include a gate electrode 125, a semiconductor 130, a source electrode 176, and a drain electrode 177.

Next, the structure of each pixel switching element, according to an embodiment of the present invention, will be described in detail with reference to FIG. 2.

The pixel switching element 200 includes a first insulating layer 141 covering the pixel electrode 710. The first insulating layer 141 may be made of a silicon nitride (SiNx) or a silicon oxide (SiOx).

A gate electrode 125 as a part of a scan line 121 and a connecting member 126 are formed on the first insulating layer 141. The connecting member 126 is connected to the underlying pixel electrode 710 through a first connection hole 41 formed in the first insulating layer 141.

A second insulating layer 142 is formed on the gate electrode 125, the connecting member 126, and the first insulating layer 141. The second insulating layer 142 may be made of a silicon nitride (SiNx) or a silicon oxide (SiOx).

A semiconductor 130 is formed on the second insulating layer 142. The semiconductor 130 overlaps the gate electrode 125. The semiconductor 130 may be made of a polysilicon or oxide semiconductor material. When the semiconductor 130 is formed of the oxide semiconductor material, a separate protection layer to protect the oxide semiconductor material that is weak (e.g., susceptible to being easily damaged) against an external environment such as a high temperature, may be added.

A third insulating layer 160 is formed on the semiconductor 130 and the second insulating layer 142. The third insulating layer 160 may be made of a silicon nitride (SiNx) or a silicon oxide (SiOx).

A source electrode 176 connected to the data line 171, and a drain electrode 177 are formed on the third insulating layer 160. The source electrode 176 and the drain electrode 177 are respectively connected to the semiconductor 130 through a pair of contact holes 61 and 62 formed in the third insulating layer 160. Also, one end of the drain electrode 177 is connected to the connecting member 126 through the second connection hole 42 formed in the third insulating layer 160 and the second insulating layer 142. Accordingly, the drain electrode 177 is connected to the underlying pixel electrode 710 through the connecting member 126.

When forming the pixel switching element thereon after forming the organic emission layer in an air atmosphere, the unstable organic emission layer may be damaged in the air atmosphere (e.g., when exposed to air) in the process of forming the pixel switching element. However, as described in reference to an exemplary embodiment of the present disclosure, when forming the pixel switching element 200 thereon after forming the white emission layer 720 including the stable quantum dots 721, the white emission layer 720 is not damaged in the process of forming the pixel switching element 200 such that the manufacturing process and the manufacturing apparatus are simplified.

The pixel switching element of a bottom gate structure, in which the gate electrode 125 is formed under the semiconductor 130, is described, however, it is not limited thereto, and a pixel switching element of a top gate structure, in which the gate electrode 125 is formed on the semiconductor 130, may be applied.

An encapsulation layer 180 to protect the white emission layer 720 from external moisture is formed on the source electrode 176, the drain electrode 177, and the third insulating layer 160. Because the white emission layer 720 is already protected from the external moisture by the hole transporting layer 740 and the electron transporting layer 750 made of the inorganic layer, the encapsulation layer 180 may be formed of various materials such as a material having a low moisture blocking force (e.g., a low moisture blocking property). That is, the encapsulation layer 180 may be formed of glass, metal, a plurality of inorganic layers, and a thin film in which the organic layer is deposited.

By forming the pixel switching element 200 on the white emission layer 720, the aperture ratio may be easily obtained in the case of the bottom emission structure, thereby realizing the high resolution.

Further, when forming a large-sized common electrode 730 of the transparent electrode having low conductivity, the common electrode is formed to be thick such that the resistance may be minimized, thereby preventing or reducing the voltage drop and realizing the large-sized display device.

When realizing the color image by using the white emission layer 720 including the quantum dots and the color filter 320, the light characteristics such as the color reproducibility or the luminance are excellent (e.g., better) compared with the case of using the organic emission layer and the color filter.

A manufacturing method of the display device according to an exemplary embodiment of the present disclosure will now be described with reference to accompanying drawings.

FIG. 3, FIG. 4, FIG. 5, and FIG. 6 are cross-sectional views sequentially showing a manufacturing method of a display device according to an exemplary embodiment of the present disclosure.

Figure 3:
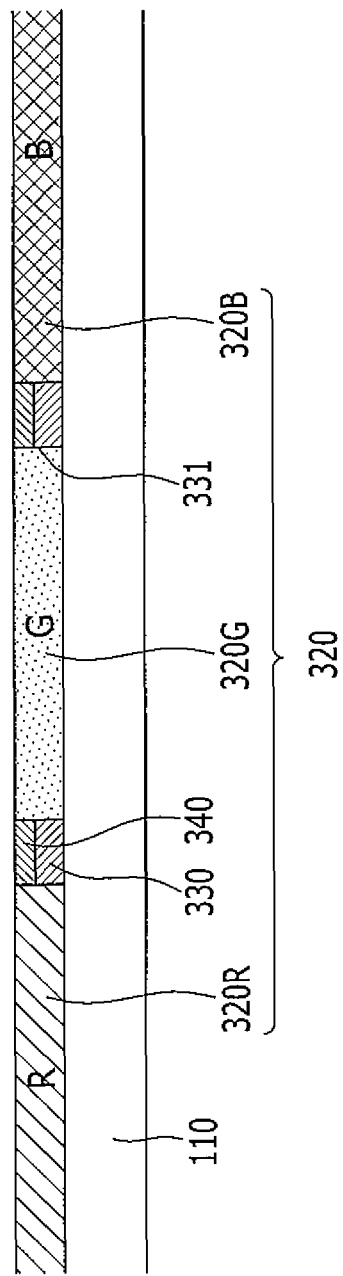
FIG. 3, FIG. 4, FIG. 5, and FIG. 6 are cross-sectional views sequentially showing a manufacturing method of a display device according to an exemplary embodiment of the present disclosure.

First, as shown in FIG. 3, a light blocking layer made of the metal chromium (Cr) or the organic material is deposited on the substrate 110. An auxiliary electrode layer of the low resistance metal or the same material as the common electrode is deposited on the light blocking layer. The light blocking layer and the auxiliary electrode layer are simultaneously patterned by a photolithography process by using a first mask. Accordingly, the light blocking member 330 having the opening 331 exposing the substrate 110 and the auxiliary electrode 340 are formed. A red color filter layer is deposited on the substrate 110 and the auxiliary electrode 340, and is patterned by the photolithography process using a second mask to form the red color filter 320R. A green color filter layer is deposited on the substrate 110, the auxiliary electrode 340, and the red color filter 320R, and is patterned by the photolithography process using a third mask to form the green color filter 320G. A blue color filter layer is deposited on the substrate 110, the auxiliary electrode 340, the red color filter 320R, and the green color filter 320G, and is patterned by the photolithography process using the fourth mask to form the blue color filter 320B.

Figure 4:
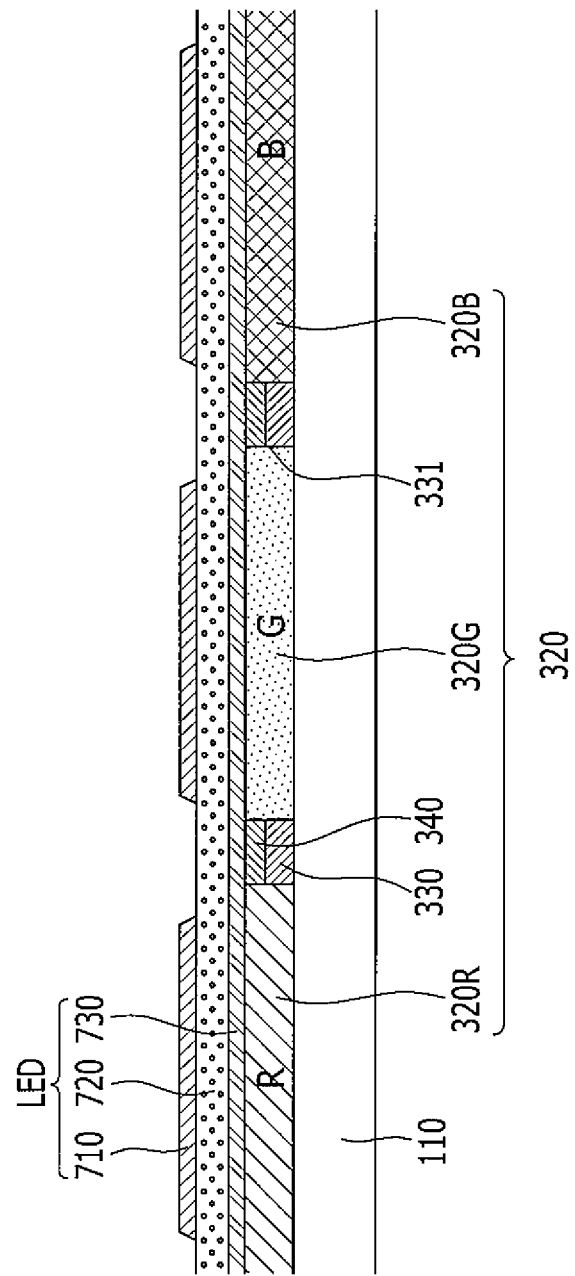

Next, as shown in FIG. 4, a common electrode 730 is formed on the color filter 320 including the red color filter 320R, the green color filter 320G, the blue color filter 320B, and the auxiliary electrode 340. A white emission layer 720 including a plurality of quantum dots 721 is formed on the common electrode 730. The common electrode 730 and the white emission layer 720 are formed throughout the entire region such that a separate mask is not used. To protect the white emission layer 720 from the external moisture, the hole transporting layer 740 of the inorganic layer is formed between the white emission layer 720 and the common electrode 730, and the electron transporting layer 750 of the inorganic layer is formed on the white emission layer 720. A pixel electrode 710 layer is formed on the white emission layer 720 and is patterned by the photolithography process using a fifth mask to form a pixel electrode 710 for each pixel.

Figure 5:
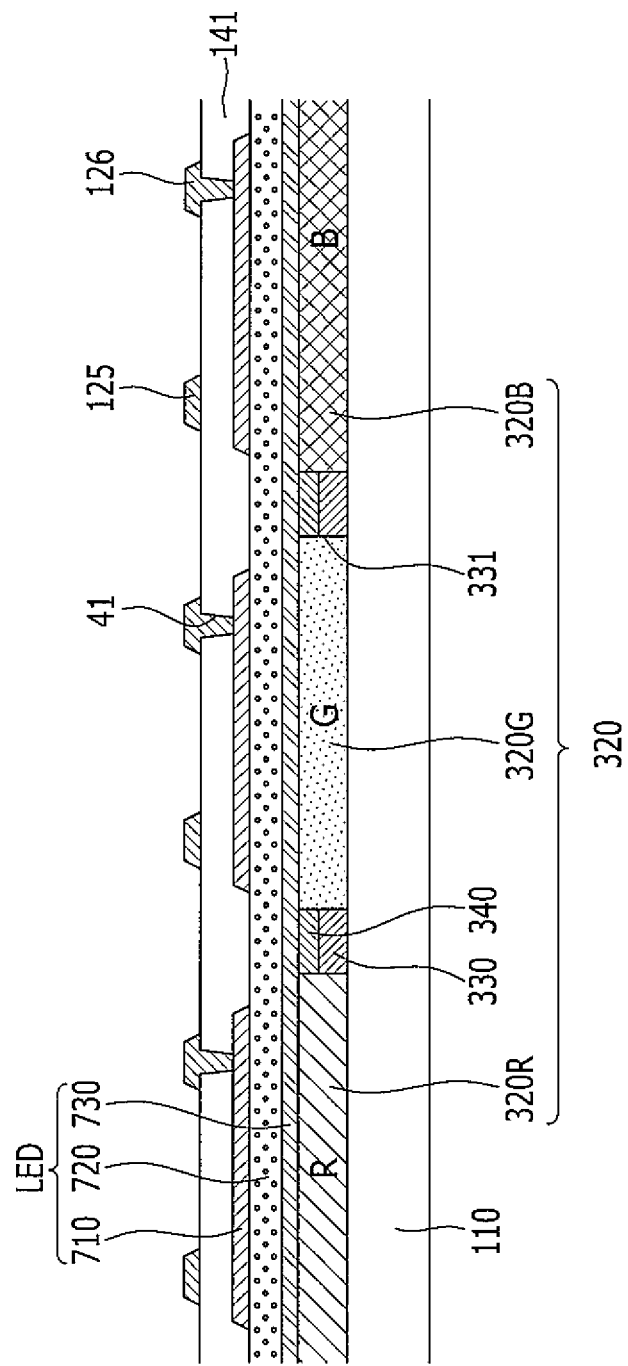
Figure 6:
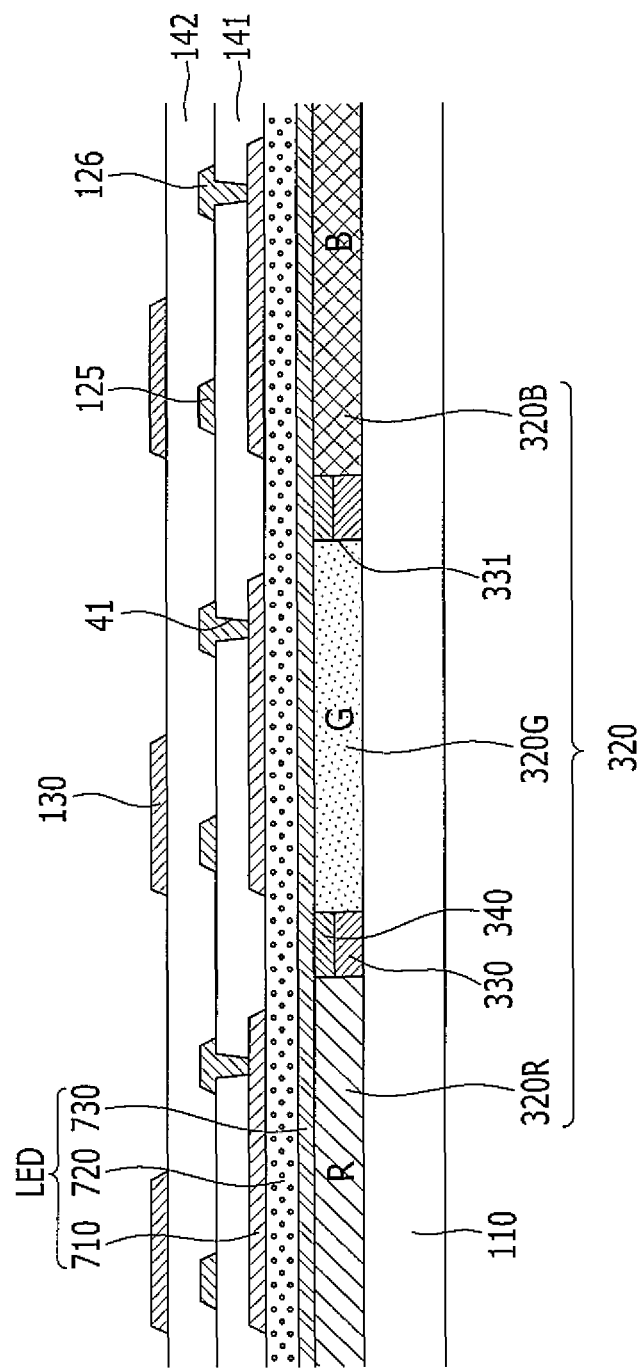

Next, as shown in FIG. 5, FIG. 6, and FIG. 2, a pixel switching element 200 is formed on the pixel electrode 710. First, as shown in FIG. 5, a first insulating layer 141 covering the pixel electrode 710 is formed. The first insulating layer 141 is formed by plasma enhanced chemical vapor deposition (PECVD) using a silicon nitride (SiNx) or a silicon oxide (SiOx) on the entire surface. Next, the first insulating layer 141 is patterned by the photolithography process using a sixth mask to form a first connection hole 41 to expose the portion of the pixel electrode 710. A gate metal layer is deposited on the first insulating layer 141. The gate metal layer is patterned by the photolithography process using a seventh mask. As a result, a gate wire including a gate electrode 125 and a connecting member 126 is formed.

Next, as shown in FIG. 6, a second insulating layer 142 covering the gate wire 125 and 126 is formed. The second insulating layer 142 is formed by the plasma enhanced chemical vapor deposition (PECVD) using a silicon nitride (SiNx) or a silicon oxide (SiOx) on the entire surface. Next, a polysilicon layer is deposited on the second insulating layer 142. The polysilicon layer is made of a polysilicon (p-Si) and the polysilicon may be formed by forming and crystallizing amorphous silicon (a-Si). The crystallizing method may be one or more of various methods known to those skilled in the art, for example, a method of crystallizing the amorphous silicon using heat, a laser, Joule heat, an electric field, or a catalyst metal. The polysilicon layer is patterned by the photolithography process using an eighth mask. As a result, a semiconductor 130 is formed.

Next, as shown in FIG. 2, a third insulating layer 160 covering the semiconductor 130 is formed. The third insulating layer 160 is formed by the plasma enhanced chemical vapor deposition (PECVD) using a silicon nitride (SiNx) or a silicon oxide (SiOx) on the entire surface. The third insulating layer 160 is patterned by the photolithography process using a ninth mask to form a pair of contact holes 61 and 62 exposing the portions of the semiconductor 130, and the third insulating layer 160 and the second insulating layer 142 are patterned to form a second connection hole 42 exposing the portion of the connecting member 126. A data metal layer is deposited on the third insulating layer 160. The data metal layer is patterned by the photolithography process using a tenth mask. Accordingly, a data wire including the source electrode 176 and the drain electrode 177 is formed on the third insulating layer 160. In this case, the drain electrode 177 is connected to the connecting member 126 through the second connection hole 42. An encapsulation layer 180 covering the data wires 176 and 177 is formed on the third insulating layer 160.

As described above, by forming the pixel switching element 200 after forming the white emission layer 720 including the stable quantum dots 721 in the air atmosphere, the white emission layer 720 is not damaged in the process

| Description of some of the symbols | |
|---|---|
| 110: substrate | 125: gate electrode |
| 126: connecting member | 130: semiconductor |
| 141: first insulating layer | 142: second insulating layer |
| 160: third insulating layer | 176: source electrode |
| 177: drain electrode | 180: encapsulation layer |
| 320: color filter | 330: light blocking member |
| 340: auxiliary electrode | 710: pixel electrode |
| 720: white emission layer | 730: common electrode |
| 740: hole transporting layer | 750: electron transporting layer |

What is claimed is:

1. A display device comprising:
a substrate;
a plurality of color filters on the substrate;
a common electrode covering the plurality of color filters;
a white emission layer covering the common electrode;
a plurality of pixel electrodes on the white emission layer; and
a plurality of pixel switching elements on the plurality of pixel electrodes and connected to the plurality of pixel electrodes, each of the plurality of pixel switching elements comprising:
a gate electrode;
a semiconductor overlapping the gate electrode;
a source electrode and a drain electrode respectively connected to the semiconductor, the drain electrode being connected to a respective one of the pixel electrodes;
a first insulating layer covering the pixel electrode, the gate electrode being on the first insulating layer;
a second insulating layer covering the gate electrode, the semiconductor being on the second insulating layer; and
a third insulating layer covering the semiconductor,
wherein the white emission layer comprises a plurality of quantum dots,
wherein both the gate electrode and the semiconductor are disposed between the drain electrode and the pixel electrode in a direction from the pixel electrode toward the gate electrode on a sectional view, and the gate electrode is disposed under the semiconductor, and
wherein the source electrode and the drain electrode are on the third insulating layer and are respectively connected to the semiconductor through a pair of contact holes in the third insulating layer.

2. The display device of claim 1, further comprising a connecting member at a same layer as the gate electrode, wherein the connecting member connects the drain electrode and the pixel electrode to each other.

3. The display device of claim 2, wherein the connecting member is connected to the pixel electrode through a first connection hole at the first insulating layer, and is connected to the drain electrode through a second connection hole at the second insulating layer and the third insulating layer.

4. The display device of claim 3, further comprising:
a light blocking member between the plurality of color filters; and
an auxiliary electrode on the light blocking member, wherein the auxiliary electrode is in contact with the common electrode.

5. The display device of claim 3, further comprising:
an encapsulation layer covering the plurality of pixel switching elements.

6. The display device of claim 3, further comprising:
an electron transporting layer and a hole transporting layer at respective sides of the white emission layer, wherein the electron transporting layer and the hole transporting layer comprise an inorganic layer.

* * * * *